United States Patent
Choi

[11] Patent Number: 6,143,465
[45] Date of Patent: Nov. 7, 2000

[54] PHOTOSENSITIVE POLYMER HAVING CYCLIC BACKBONE AND RESIST COMPOSITION COMPRISING SAME

[75] Inventor: Sang-jun Choi, Seoul, Rep. of Korea

[73] Assignee: Samsung Electronics Co., Ltd., Suwon, Rep. of Korea

[21] Appl. No.: 09/349,159

[22] Filed: Jul. 8, 1999

[30] Foreign Application Priority Data

Aug. 18, 1998 [KR] Rep. of Korea ................. 98-33496
Dec. 24, 1998 [KR] Rep. of Korea ................. 98-58044

[51] Int. Cl.[7] ............... G03F 7/004; C08F 10/00
[52] U.S. Cl. ............... 430/270.1; 430/905; 526/272; 526/281
[58] Field of Search ............... 430/270.1, 905; 526/281, 272

[56] References Cited

U.S. PATENT DOCUMENTS 5,843,624 12/1998 Houlihan et al. ............... 430/296
6,028,153 2/2000 Jung ............... 526/258
6,063,542 5/2000 Hyeon et al. ............... 430/270.1

OTHER PUBLICATIONS

Alicyclic Polymers for 193nm Resist Applications, Okoroanyanwu, U. et al., Chem. Mater. 1998, 10, 3319–3327.
New Positive Resists with Cycloaliphatic Structures in the Main Chain, Meyer, U. et al, Euro.Pol.J., 1999, 35, 69–76.

*Primary Examiner*—Janet Baxter
*Assistant Examiner*—Rosemary Ashton
*Attorney, Agent, or Firm*—Kile, McIntyre, Harbin & Lee; Eugene M. Lee

[57] ABSTRACT

A photosensitive polymer represented by the following formula, and a resist composition including (a) a photosensitive polymer represented by the following formula:

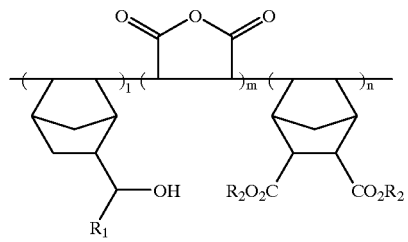

where $R_1$ is a $C_1$ to $C_{20}$ aliphatic hydrocarbon, $R_2$ is t-butyl, tetrahydropyranyl or 1-alkoxy ethyl, $1/(1+m+n)$ is from 0.0 to about 0.4, $m/(1+m+n)$ is 0.5, and $n/(1+m+n)$ is from about 0.1 to about 0.5, and (b) a photoacid generator (PAG).

20 Claims, No Drawings

PHOTOSENSITIVE POLYMER HAVING CYCLIC BACKBONE AND RESIST COMPOSITION COMPRISING SAME

BACKGROUND OF THE INVENTION

1. Field of the Invention

The present invention relates to a chemically amplified resist composition and, more particularly, to a photosensitive polymer whose backbone has a cyclic structure, and to a resist composition containing the photosensitive polymer for an ArF excimer laser.

2. Description of the Related Art

As semiconductor devices become highly integrated and complicated to fabricate, fine pattern formation is required. Further, as the capacity of a semiconductor device increases to exceed 1 giga bit, a pattern size having a design rule of less than 0.2 μm is required. Accordingly, there are limitations in using a conventional resist material with a KrF excimer laser (248 nm). Thus, a new resist material capable of being developed using an ArF excimer laser (193 nm) has been developed in a lithography process.

The conventional resist material used in the lithography process using the ArF excimer laser has several problems in commercial use, when compared to the conventional resist materials using other lasers, such as the KrF excimer laser. The most typical problems include transmittance of a polymer, and resistance to dry etching. As the widely known ArF resist materials, (meth)acrylate polymers are generally used. In particular, the most typical resist material is poly (methyl methacrylate-tert-butyl methacrylate-methacrylic acid) terpolymer system manufactured by IBM, Inc. However, such polymers have very weak resistance to dry etching. Accordingly, to increase the resistance to dry etching, a polymer having a backbone composed of an alicyclic compound such as an isobornyl group, an adamantyl group or a tricyclodecanyl group, is used. However, the resulting resist still exhibits weak resistance to dry etching.

SUMMARY OF THE INVENTION

Thus, there exists a need to develop a resist composition that does not suffer from the aforementioned problems. To solve the above problems, it is a feature of the present invention to provide a photosensitive polymer whose backbone has a cyclic structure and contains an alicyclic compound, for obtaining sufficiently strong resistance to dry etching.

It is another feature of the present invention to provide a resist composition containing the photosensitive polymer, suitable for use in a lithography process using an ArF excimer laser.

In accordance with these and other features of the present invention, there is provided a photosensitive polymer represented by the following formula:

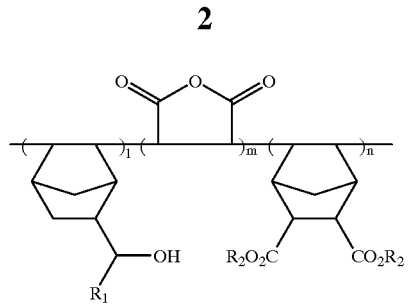

where $R_1$ is a $C_1$ to $C_{20}$ aliphatic hydrocarbon, $R_2$ is t-butyl, tetrahydropyranyl or 1-alkoxy ethyl, $1/(1+m+n)$ is from 0.0 to about 0.4, $m/(1+m+n)$ is 0.5, and $n/(1+m+n)$ is from 0.1 to about 0.5.

In accordance with an additional feature of the present invention, there is provided a resist composition comprising (a) a photosensitive polymer represented by the following formula:

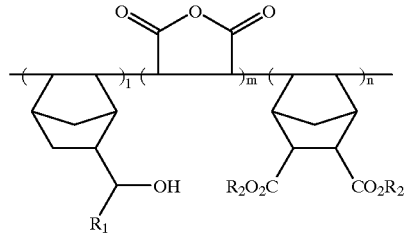

where $R_1$ is a $C_1$ to $C_{20}$ aliphatic hydrocarbon, $R_2$ is t-butyl, tetrahydropyranyl or 1-alkoxy ethyl, $1/(1+m+n)$ is from 0.0 to about 0.4, $m/(1+m+n)$ is 0.5, and $n/(1+m+n)$ is from 0.1 to about 0.5, and (b) at least one photoacid generator (PAG).

These and other features of the present invention will be readily apparent to those skilled in the art upon review of the detailed description of preferred embodiments which follows.

DETAILED DESCRIPTION OF PREFERRED EMBODIMENTS

Korean application no. 98-33496, filed Aug. 18, 1998, and Korean application no. 98-58044, filed Dec. 24, 1998, are hereby incorporated by reference as if fully set forth herein.

The present invention provides a photosensitive polymer, preferably for use in a chemically amplified resist, the polymer being represented by the following formula:

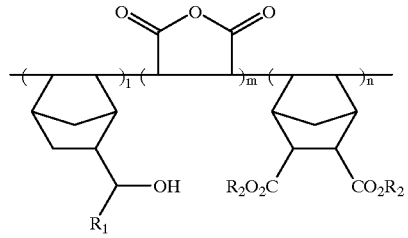

where $R_1$ is a $C_1$ to $C_{20}$ aliphatic hydrocarbon, $R_2$ is t-butyl, tetrahydropyranyl or 1-alkoxy ethyl, $1/(1+m+n)$ is from 0.0 to about 0.4, $m/(1+m+n)$ is 0.5, and $n/(1+m+n)$ is from 0.1 to about 0.5.

The polymer preferably has a weight-average molecular weight of from about 3,000 to about 100,000.

$R_1$ preferably is a $C_7$ to $C_{20}$ alicyclic aliphatic hydrocarbon, and more preferably $R_1$ is a norbornyl group. $R_2$ preferably is a 1-ethoxyethyl group.

The present invention also provides a resist composition comprising (a) a photosensitive polymer, preferably for use in a chemically amplified resist, the polymer being represented by the following formula:

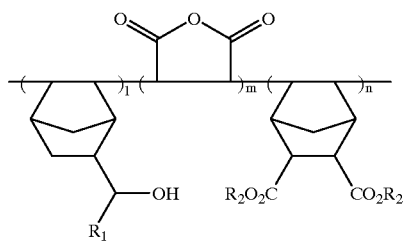

where $R_1$ is a $C_1$ to $C_{20}$ aliphatic hydrocarbon, $R_2$ is t-butyl, tetrahydropyranyl or 1-alkoxy ethyl, $1/(1+m+n)$ is from 0.0 to about 0.4, $m/(1+m+n)$ is 0.5, and $n/(1+m+n)$ is from 0.1 to about 0.5, and (b) at least one photoacid generator (PAG).

The resist composition contains an acid generating effective amount of the photoacid generator, and preferably contains from 1 to about 15 weight percent of the photo acid generator based on the weight of the polymer.

The PAG can be any PAG known in the art, and preferably is one capable of generating an acid upon exposure to light. Preferably, the PAG is at least one compound selected from the group consisting of triarylsulfonium salts, diaryliodonium salts, sulfonates, and mixtures thereof. More preferably, the PAG is at least one compound selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, and mixtures thereof.

The resist composition may further comprise an organic base. Here, the resist composition usually comprises from 0.01 to about 2.0 weight percent of the organic base based on the weight of the polymer. The organic base preferably is at least one compound selected from the group consisting of triethyl amine, triisobutylamine, triisooctylamine, and mixtures thereof. In addition, the organic base may be at least one compound selected from the group consisting of diethanol amine, triethanol amine, and mixtures thereof.

The resist composition according to the present invention may further comprise a dissolution inhibitor. The dissolution inhibitor preferably is included in an amount of from 1 to about 30 weight percent based on the weight of the polymer. Preferably, the dissolution inhibitor is sarsasapogenin.

Those skilled in the art are capable of formulating a suitable resist composition containing any of the aforementioned components, as well as other additives typically used in resist compositions, using the guidelines provided herein.

According to the present invention, there is provided a photosensitive polymer whose backbone has a cyclic structure and contains an alicyclic compound, thereby attaining resistance to dry etching. Also, excellent lithographic performance can be obtained by using the resist composition obtained from the polymer.

Next, preferred embodiments of the present invention will be described in more detail with reference to preferred embodiments illustrated by the following examples.

EXAMPLE 1

Synthesis of 2,3-di-tert-butoxycarbonyl 5-norbornene

The synthesis reaction of 2,3-di-tert-butoxycarbonyl 5-norbornene is represented by the following reaction.

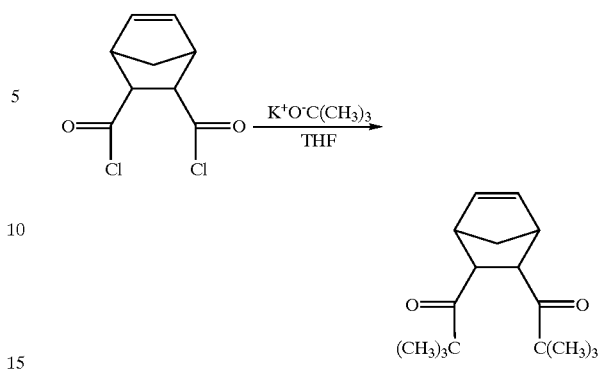

Potassium tert-butoxide (34 g; 0.3 mol) was dissolved in 250 ml of anhydrous tetrahydrofuran (THF) in a round-bottom flask. 5-norbornene-2,3-dicarbonyl chloride (22 g; 0.1 mol) then was slowly added thereto at room temperature, and the reactant was reacted at a temperature of 45° C. for about 12 hours.

After the reaction was completed, excess solvent was evaporated, the product was poured into excess water and neutralized using HCl. Thereafter, the product was extracted using diethyl ether, dried using $MgSO_4$, and recrystallized in n-hexane/methylene chloride solution to then separate a desired product (yield: 32 g).

EXAMPLE 2

Synthesis of 2,3-di-tetrahydropyranyloxycarbonyl 5-norbornene

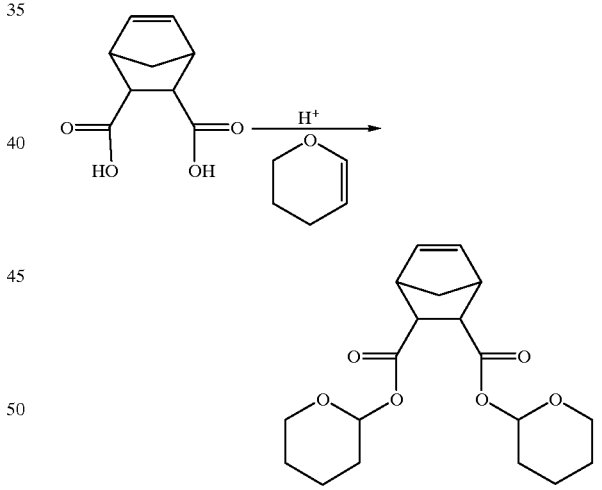

5-norbornene-2,3-dicarboxylic acid (18.2 g; 0.1 mol) and 34 g of 2,3-dihydropyran (0.4 mol) were dissolved in 150 ml of methylene chloride in a round-bottom flask, and a small amount of p-toluene sulfonic acid was added thereto. Thereafter, the reactant was reacted in a reflux condition for about 12 hours.

After the reaction was completed, the obtained product was poured into excess water and neutralized using potassium carbonate. Thereafter, the product was extracted using methylene chloride and recrystallized in n-hexane/methylene chloride solution to then separate a desired product (yield: 80%).

EXAMPLE 3

Synthesis of 5-norbornene-2-norbornylmethanol

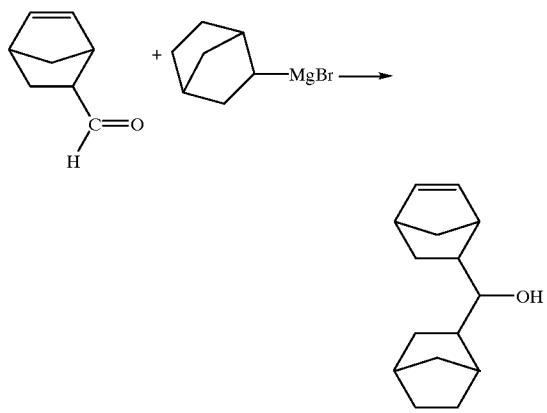

2-norbornyl magnesiumbromide (200 ml; 0.1 mol in THF) solution was poured into a round-bottom flask and 14 g of 5-norbornene-2-carboxaldehyde (0.11 mol) was slowly dropped thereinto and the reactant was reacted at 45° C. for about 20 hours.

After the reaction was completed, excess THF was evaporated using a rotary evaporator, the reactant was poured into excess water and neutralized using HCl, and the product was extracted using diethyl ether and dried using magnesium sulfate to then separate a desired product by vacuum distillation (yield: 45%).

EXAMPLE 4

Synthesis of Terpolymer

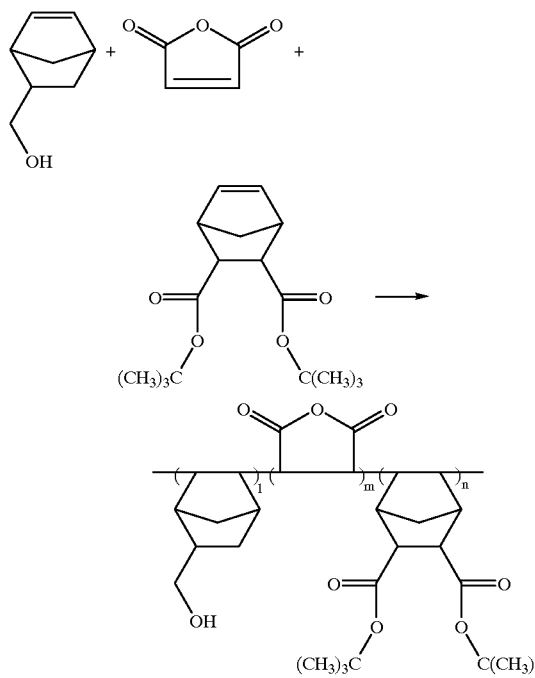

The monomer synthesized in Example 1 (12 g; 40 mmol), 1.3 g of 5-norbornene-2-methanol (10 mmol), 4.9 g of maleic anhydride (50 mmol) and 0.16 g of azobis (isobutyronitrile) (AIBN) were dissolved in 20 g of anhydrous dioxane, purged using nitrogen gas for about 1 hour and then the reactant was polymerized at 65° C. for about 24 hours.

After the polymerization was completed, the reactant was slowly dropped into excess n-hexane to be precipitated, dissolved again in THF and reprecipitated in n-hexane. The precipitated material was dried in a vacuum oven maintained at 50° C. for 24 hours.

The weight-average molecular weight and polydispersity of the obtained product were 12,500 and 2.1, respectively.

EXAMPLE 5

Synthesis of Terpolymer

The monomer synthesized in Example 2 (16 g; 45 mmol), 0.6 g of 5-norbornene-2-methanol (5 mmol), 4.9 g of maleic anhydride (50 mmol) and 0.16 g of azobis(isobutyronitrile) (AIBN) were dissolved in 25 g of anhydrous dioxane, purged using nitrogen gas for 1 hour and then the reactant was polymerized at 65° C. for about 24 hours.

After the polymerization was completed, the reactant was slowly dropped into 20 excess n-hexane to be precipitated, dissolved again in THF and reprecipitated in n-hexane and then the precipitated material was dried in a vacuum oven maintained at 50° C. for 24 hours.

The weight-average molecular weight and polydispersity of the obtained product were 12,700 and 2.2, respectively.

EXAMPLE 6

Synthesis of Terpolymer

The synthesis reaction of a terpolymer according to this embodiment can be represented by the following reaction.

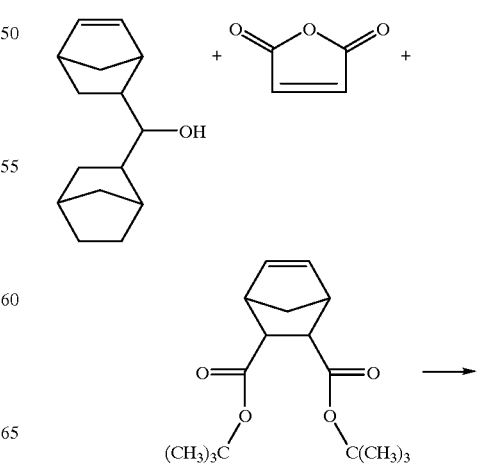

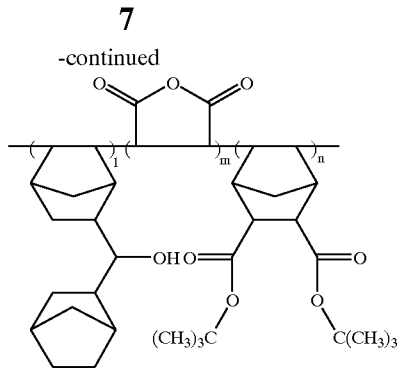

The monomer (8.8 g; 30 mmol) synthesized in Example 1, 4.4 g of monomer (20 mmol) synthesized in Example 3, 4.9 g of maleic anhydride (50 mmol) and 0.16 g of azobis (isobutyronitrile) (AIBN) were dissolved in 20 g of anhydrous dioxane, purged using nitrogen gas for 1 hour and then the reactant was polymerized at 65° C. for about 24 hours.

After the polymerization was completed, the reactant was slowly dropped into excess n-hexane to be precipitated, dissolved again in THF and reprecipitated in n-hexane and then the precipitated material was dried in a vacuum oven maintained at 50° C. for 24 hours.

The weight-average molecular weight and polydispersity of the obtained product were 13,200 and 2.0, respectively.

EXAMPLE 7

Resist Composition

The terpolymer (1.0 g) synthesized in Example 4 and 0.03 g of triphenyl sulfonium triflate were completely dissolved in 6.0 g of propylene glycol monomethyl ether acetate (PGMEA). Thereafter, the solution was filtered using a 0.2 μm membrane filter to obtain a resist composition. Then, the resist composition was coated on a silicon wafer treated with hexamethyldisilazane (HMDS) to a thickness of about 0.5 μm.

The wafer having the resist composition coated thereon was pre-baked at a temperature of 130° C. for 90 seconds and exposed to light using a KrF excimer laser having a numerical aperture of 0.45. Then, post exposure baking (PEB) was performed at a temperature of 140° C. for 90 seconds.

Thereafter, the resultant resist material was developed using 2.38 wt % of tetramethylammonium hydroxide (TMAH) solution for about 60 seconds. As a result, when an exposure dose was about 21 mJ/cm$^2$, it was observed that a clean 0.4 μm line and space pattern was obtained.

EXAMPLE 8

Resist Composition

The terpolymer (1.0 g) synthesized in Example 5 and 0.03 g of triphenyl sulfonium triflate were completely dissolved in 6.0 g of PGMEA. The solution was filtered using a 0.2 μm membrane filter to obtain a resist composition. Then, the resist composition was coated on a silicon wafer treated with HMDS to a thickness of about 0.5 μm.

The wafer having the resist composition coated thereon was pre-baked at a temperature of 100° C. for 90 seconds and exposed to light using a KrF excimer laser having a numerical aperture of 0.45. Then, post exposure baking (PEB) was performed at a temperature of 110° C. for 90 seconds.

The resultant resist material was developed using 2.38 wt % of TMAH solution for about 60 seconds. As a result, when an exposure dose was about 17 mJ/cm$^2$, it was observed that a clean 0.4 μm line and space pattern was obtained.

EXAMPLE 9

Resist Composition

The terpolymer (1.0 g) synthesized in Example 6 and 0.03 g of triphenyl sulfonium triflate were completely dissolved in 6.0 g of PGMEA. The solution was filtered using a 0.2 μm membrane filter to obtain a resist composition. Then, the resist composition was coated on a silicon wafer treated with HMDS to a thickness of about 0.5 μm.

The wafer having the resist composition coated thereon was pre-baked at a temperature of 130° C. for 90 seconds and exposed to light using a KrF excimer laser having a numerical aperture of 0.45. Then, post exposure baking (PEB) was performed at a temperature of 140° C. for 90 seconds.

The resultant resist material was developed using 2.38 wt % of TMAH solution for about 60 seconds. As a result, when an exposure dose was about 25 mJ/cm$^2$, it was observed that a clean 0.4 μm line and space pattern was obtained.

EXAMPLE 10

Lithographic Performance

The terpolymer (1.0 g) synthesized in Example 4 [1:m:n= 2:10:8 and weight-average molecular weight=12,500] and 0.02 g of triphenyl sulfonium triflate were completely dissolved in 6.0 g of PGMEA. The obtained solution was completely dissolved in 2 mg of triethanol amine as an organic base and then filtered using a 0.2 μm membrane filter to obtain a resist composition. Then, the resist composition was coated on a silicon wafer treated with HMDS to a thickness of about 0.5 μm.

The wafer having the resist composition coated thereon was pre-baked at a temperature of 140° C. for 90 seconds and exposed to light using an ArF excimer laser having a numerical aperture of 0.60. Then, post exposure baking (PEB) was performed at a temperature of 140° C. for 90 seconds.

The resultant resist material was developed using 2.38 wt % of TMAH solution for about 60 seconds. As a result, when an exposure dose was about 18 mJ/cm$^2$, it was observed that a clean 0.3 μm line and space pattern was obtained.

EXAMPLE 11

Lithographic Performance

Sarsasapogenin (0.07 g) was added as a dissolution inhibitor to the resist composition synthesized in Example 10 to obtain a resist composition. Then, the lithographic performance was evaluated in the same manner as that of Example 10. As a result, when an exposure dose was about 21 mJ/cm$^2$, it was observed that a clean 0.3 μm line and space pattern was obtained.

EXAMPLE 12

Lithographic Performance

The terpolymer (1.0 g) synthesized in Example 5 [1:m:n= 1:10:9 and weight-average molecular weight=12,700] and 0.02 g of triphenyl sulfonium triflate were completely dissolved in 6.0 g of PGMEA. The obtained solution was completely dissolved in 2 mg of triethanol amine as an organic base and then filtered using a 0.2 μm membrane filter to obtain a resist composition. Then, the resist composition was coated on a silicon wafer treated with HMDS to a thickness of about 0.5 μm.

The wafer having the resist composition coated thereon was pre-baked at a temperature of 100° C. for 90 seconds and exposed to light using an ArF excimer laser having a numerical aperture of 0.60. Then, post exposure baking (PEB) was performed at a temperature of 110° C. for 90 seconds.

The resultant resist material was developed using 2.38 wt % of TMAH solution for about 60 seconds. As a result, when an exposure dose was about 20 mJ/cm$^2$, it was observed that a clean 0.30 μm line and space pattern was obtained.

EXAMPLE 13

Lithographic Performance

The terpolymer (1.0 g) synthesized in Example 6 [1:m:n= 4:10:6 and weight-average molecular weight=13,200] and 0.02 g of triphenyl sulfonium triflate were completely dissolved in 6.0 g of PGMEA. The obtained solution was completely dissolved in 2 mg of triethanol amine as an organic base and then filtered using a 0.2 μm membrane filter to obtain a resist composition. Then, the resist composition was coated on a silicon wafer treated with HMDS to a thickness of about 0.5 μm.

The wafer having the resist composition coated thereon was pre-baked at a temperature of 130° C. for 90 seconds and exposed to light using an ArF excimer laser having a numerical aperture of 0.60. Then, post exposure baking (PEB) was performed at a temperature of 140° C. for 90 seconds.

The resultant resist material was developed using 2.38 wt % of TMAH solution for about 60 seconds. As a result, when an exposure dose was about 24 mJ/cm$^2$, it was observed that a clean 0.30 μm line and space pattern was obtained.

As described above, according to the present invention, by providing a cyclopolymer whose backbone has a cyclic structure and contains an alicyclic compound, sufficiently increased dry etching resistance of the polymer can be obtained. Also, in the present invention, since a monomer having two protecting groups is used, the resist contrast can be increased by an increasing difference in solubility between before and after the polymer is exposed to light.

Also, adhesiveness to a film material can be increased by introducing a hydroxy group which increases adhesiveness into the backbone of the polymer. Further, the resist can be patterned using a general developer solution, i.e., 2.38 wt % TMAH solution. Therefore, excellent lithographic performance can be obtained using the resist composition obtained from the polymer, and the resist composition according to the present invention can be useful in the manufacture of next generation semiconductor devices.

Although the present invention has been described in detail through preferred embodiments, the invention is not limited thereto, and various modifications and alterations within the spirit and scope of the invention are possible by those skilled in the art.

What is claimed is:

1. A photosensitive polymer represented by the following formula:

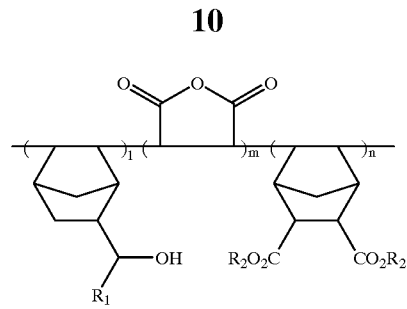

where $R_1$ is selected from the group consisting of hydrogen, $C_1$ to $C_{20}$ aliphatic hydrocarbon, and $C_7$ to $C_{20}$ alicyclic hydrocarbon, $R_2$ is selected from the group consisting of t-butyl, tetrahydropyranyl and 1-alkoxy ethyl, $1/(1+m+n)$ is from 0.0 to about 0.4, $m/(1+m+n)$ is 0.5, and $n/(1+m+n)$ is from about 0.1 to about 0.5.

2. The photosensitive polymer according to claim 1, wherein the polymer has a weight-average molecular weight of from about 3,000 to about 100,000.

3. The photosensitive polymer according to claim 1, wherein $R_1$ is a $C_7$ to $C_{20}$ alicyclic aliphatic hydrocarbon.

4. The photosensitive polymer according to claim 1, wherein $R_1$ is a norbornyl group.

5. The photosensitive polymer according to claim 1, wherein $R_2$ is a 1-ethoxyethyl group.

6. A resist composition comprising:
(a) a photosensitive polymer represented by the following formula:

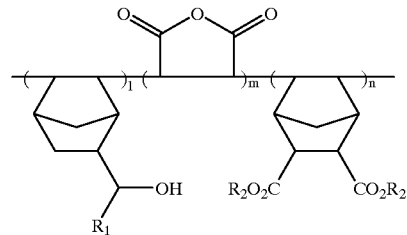

where $R_1$ is selected from the group consisting of hydrogen, $C_1$ to $C_{20}$ aliphatic hydrocarbon, and $C_7$ to $C_{20}$ alicyclic hydrocarbon, $R_2$ is selected from the group consisting of t-butyl, tetrahydropyranyl and 1-alkoxy ethyl, $1/(1+m+n)$ is from 0.0 to about 0.4, $m/(1+m+n)$ is 0.5, and $n/(1+m+n)$ is from about 0.1 to about 0.5; and (b) a photoacid generator (PAG).

7. The resist composition according to claim 6, wherein the polymer has a weight-average molecular weight of from about 3,000 to about 100,000.

8. The resist composition according to claim 6, wherein $R_1$ is a $C_7$ to $C_{20}$ alicyclic aliphatic hydrocarbon.

9. The resist composition according to claim 6, wherein $R_1$ is a norbornyl group.

10. The resist composition according to claim 6, wherein $R_2$ is a 1-ethoxyethyl group.

11. The resist composition according to claim 6, wherein the photoacid generator is present in an amount of from about 1 to about 15 weight percent based on the weight of the polymer.

12. The resist composition according to claim 6, wherein the PAG is at least one compound selected from the group consisting of triarylsulfonium salts, diaryliodonium salts, sulfonates, and mixtures thereof.

13. The resist composition according to claim 6, wherein the PAG is at least one compound selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxy succinimide triflate, and mixtures thereof.

14. The resist composition according to claim 6, further comprising an organic base.

15. The resist composition according to claim 14, wherein the organic base is present in an amount of from about 0.01 to about 2.0 weight percent based on the weight of the polymer.

16. The resist composition according to claim 14, wherein the organic base is at least one compound selected from the group consisting of triethyl amine, triisobutylamine, triisooctylamine, and mixtures thereof.

17. The resist composition according to claim 14, wherein the organic base is at least one compound selected from the group consisting of diethanol amine, triethanol amine, and mixtures thereof.

18. The resist composition according to claim 6, further comprising a dissolution inhibitor.

19. The resist composition according to claim 18, wherein the dissolution inhibitor is present in an amount of from about 1 to about 30 weight percent based on the weight of the polymer.

20. The resist composition according to claim 18, wherein the dissolution inhibitor is sarsasapogenin.

* * * * *